United States Patent
Sayeh et al.

(10) Patent No.: US 9,806,697 B2
(45) Date of Patent: Oct. 31, 2017

(54) ALL-OPTICAL PROTERETIC PHOTONIC INTEGRATED DEVICE

(71) Applicant: Board of Trustees, Southern Illinois University, Carbondale, IL (US)

(72) Inventors: Mohammad R. Sayeh, Carbondale, IL (US); Nima Davoudzadeh Mahboub Sedigh, Carbondale, IL (US); Mohamad Tafazoli Mehrjerdi, Carbondale, IL (US)

(73) Assignee: Board of Trustees, Southern Illinois University, Carbondale, IL (US)

( * ) Notice: Subject to any disclaimer, the term of this patent is extended or adjusted under 35 U.S.C. 154(b) by 0 days.

(21) Appl. No.: 15/200,104

(22) Filed: Jul. 1, 2016

(65) Prior Publication Data

US 2017/0005644 A1    Jan. 5, 2017

Related U.S. Application Data

(60) Provisional application No. 62/187,519, filed on Jul. 1, 2015.

(51) Int. Cl.
| | |
|---|---|
| *H03K 3/00* | (2006.01) |
| *H03K 3/037* | (2006.01) |
| *H03M 3/00* | (2006.01) |
| *G02F 1/00* | (2006.01) |
| *H01S 5/14* | (2006.01) |
| *H01S 3/083* | (2006.01) |
| *H01S 5/40* | (2006.01) |

(52) U.S. Cl.
CPC ............. *H03K 3/0377* (2013.01); *G02F 1/00* (2013.01); *H01S 5/14* (2013.01); *H03K 3/0372* (2013.01); *H03M 3/30* (2013.01); *H01S 3/083* (2013.01); *H01S 5/4025* (2013.01)

(58) Field of Classification Search
CPC ........ A47K 10/3687; A47K 10/34; H05F 3/02
See application file for complete search history.

(56) References Cited

U.S. PATENT DOCUMENTS

| | | | | |
|---|---|---|---|---|
| 5,130,526 A | * | 7/1992 | Mischel | H03K 17/795 250/214 A |
| 6,043,675 A | * | 3/2000 | Miyamoto | G06F 7/5013 326/11 |
| 6,597,352 B1 | * | 7/2003 | Haapakoski | G09G 5/006 345/211 |
| 2002/0117340 A1 | * | 8/2002 | Stettner | B60G 17/019 180/169 |
| 2008/0123701 A1 | * | 5/2008 | He | H01S 5/026 372/23 |
| 2014/0330404 A1 | * | 11/2014 | Abdelghani | A61B 5/0476 700/83 |
| 2014/0365702 A1 | * | 12/2014 | Ray | H04L 12/12 710/305 |

* cited by examiner

*Primary Examiner* — Sibin Chen
(74) *Attorney, Agent, or Firm* — Husch Blackwell LLP

(57) ABSTRACT

An apparatus and a method for a design and a simulation of an all-optical proteretic bi-stable device. The proteresis is a reversed hysteresis with an interesting characteristic which increases the oscillation frequency of a feed-back system with a relaxation dynamics by reducing the feed-back delay. The calculation of the bi-stable device parameters, a simulation of the theoretical device, and a simulation of the all-optical device are given. Applications of the proteretic device in ultra-high speed oscillations are also disclosed.

12 Claims, 24 Drawing Sheets

: A Proteretic device using two bi-stable devices

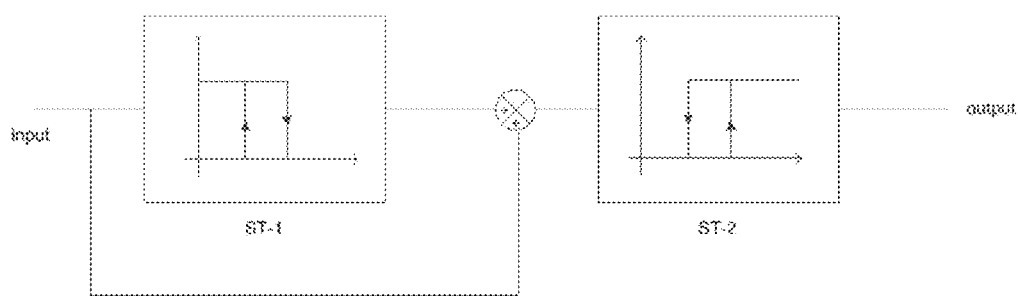
Figure 9: A Proteretic device using two bi-stable devices
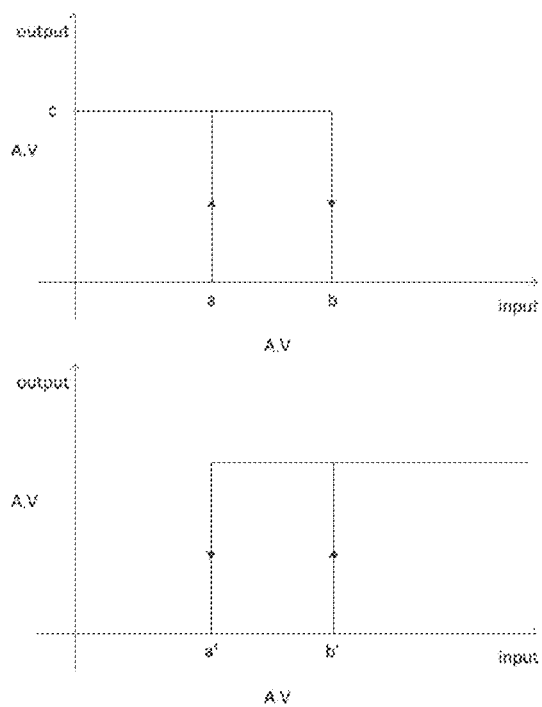
Figure 10 Transfer function of inverting and non-inverting Schmitt triggers viz. ST-1 and ST-2

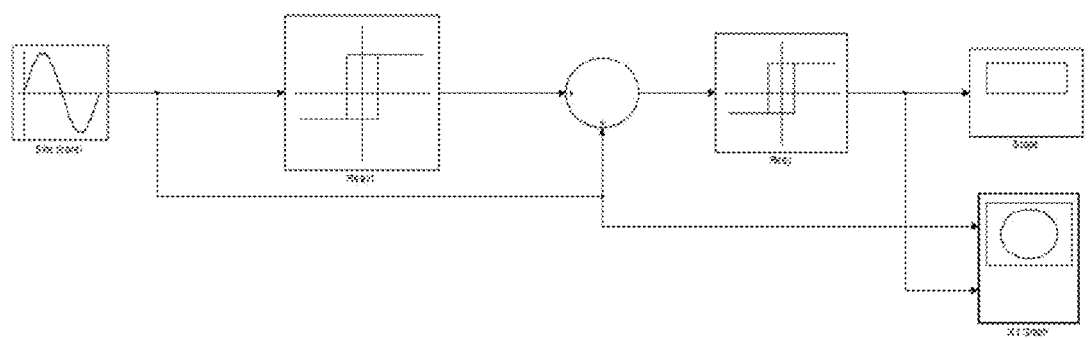
Figure 11 Design of Proteretic Device using Schmitt Triggers in Simulink Matlab

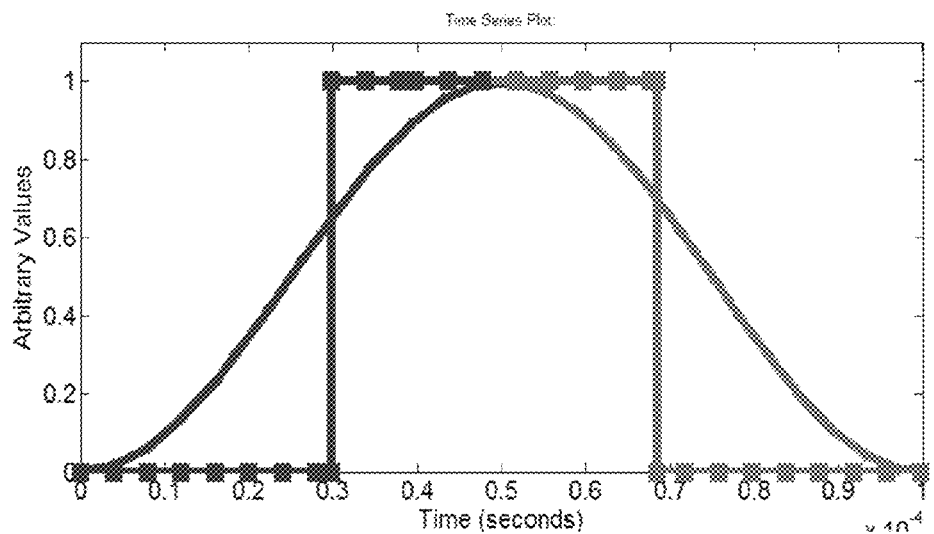
Figure 12A Results of the Proteretic Device showing time domain signal and transfer function
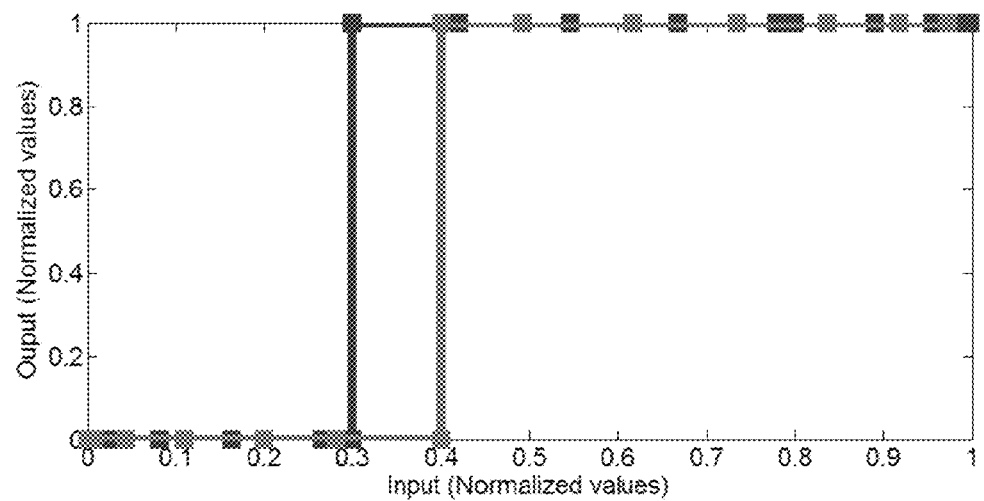
Figure 12B Results of the Proteretic Device showing time domain signal and transfer function

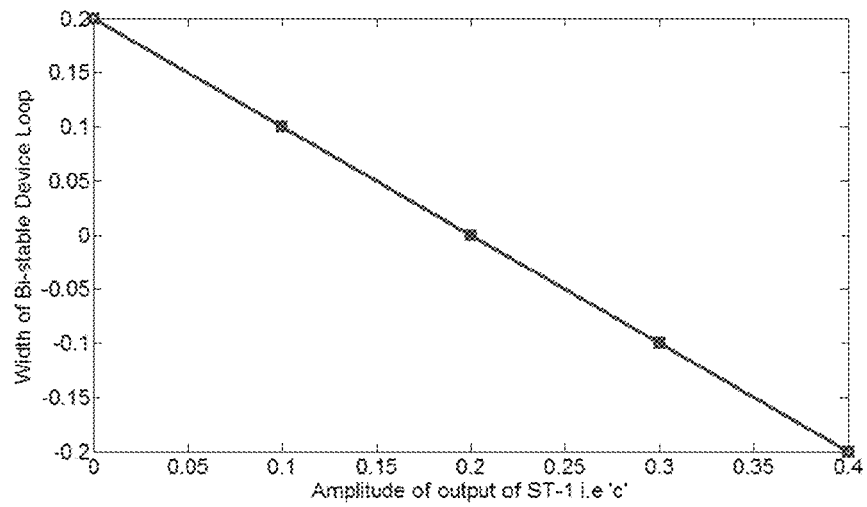
Figure 13A Effect of varying the amplitude of ST-1 i.e. 'c' on the width of loop of bi-stable device
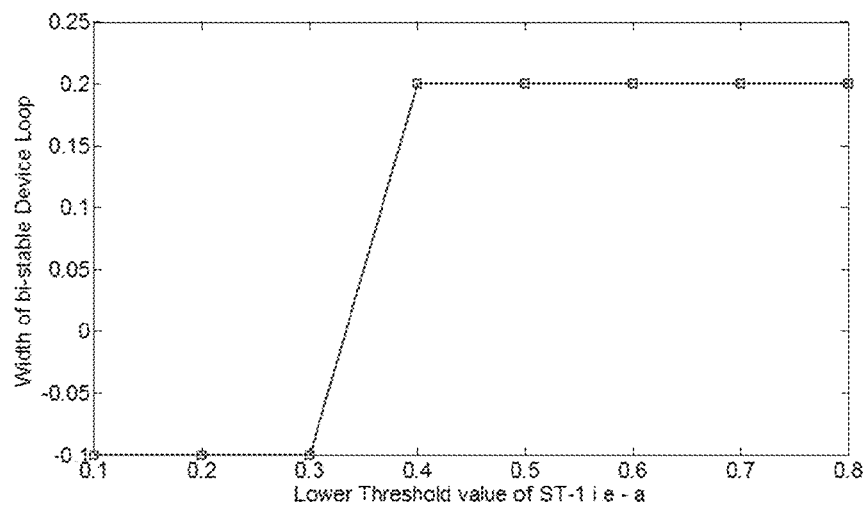
Figure 13B Effect of varying the lower threshold value of ST-1 i.e. the value - a

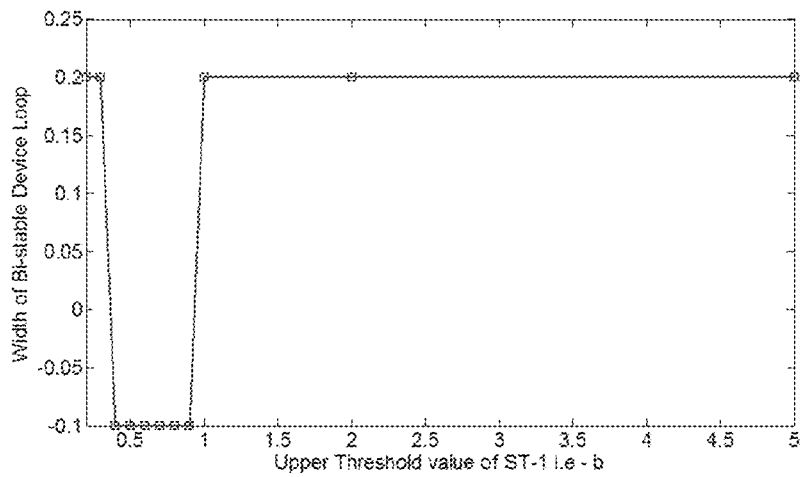
Figure 13C Effect of varying the upper threshold value of ST-1 i.e. the value - b
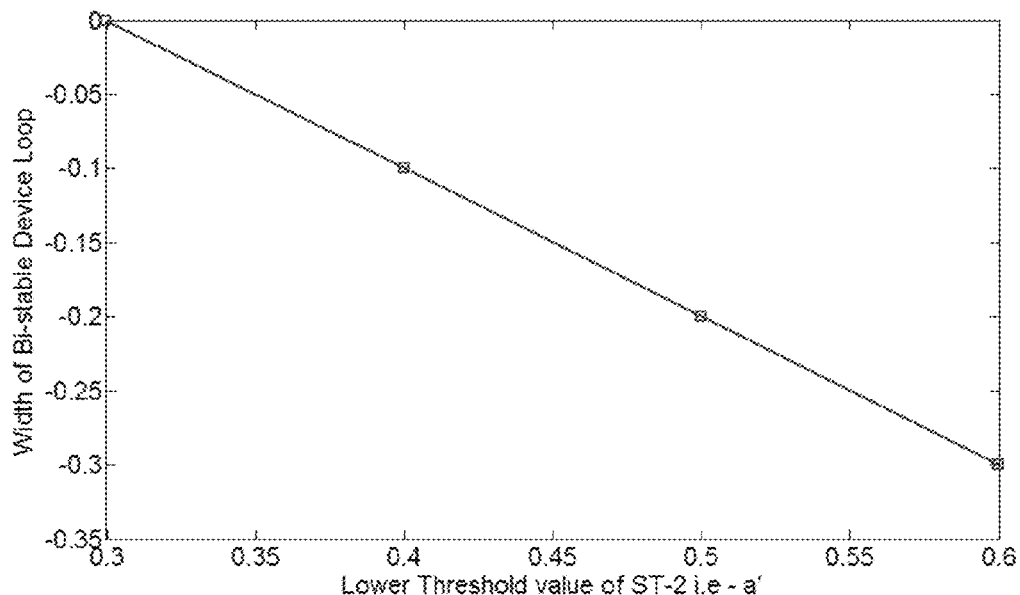
Figure 13D Effect of varying the lower threshold value of ST-2 i.e. the value - a'

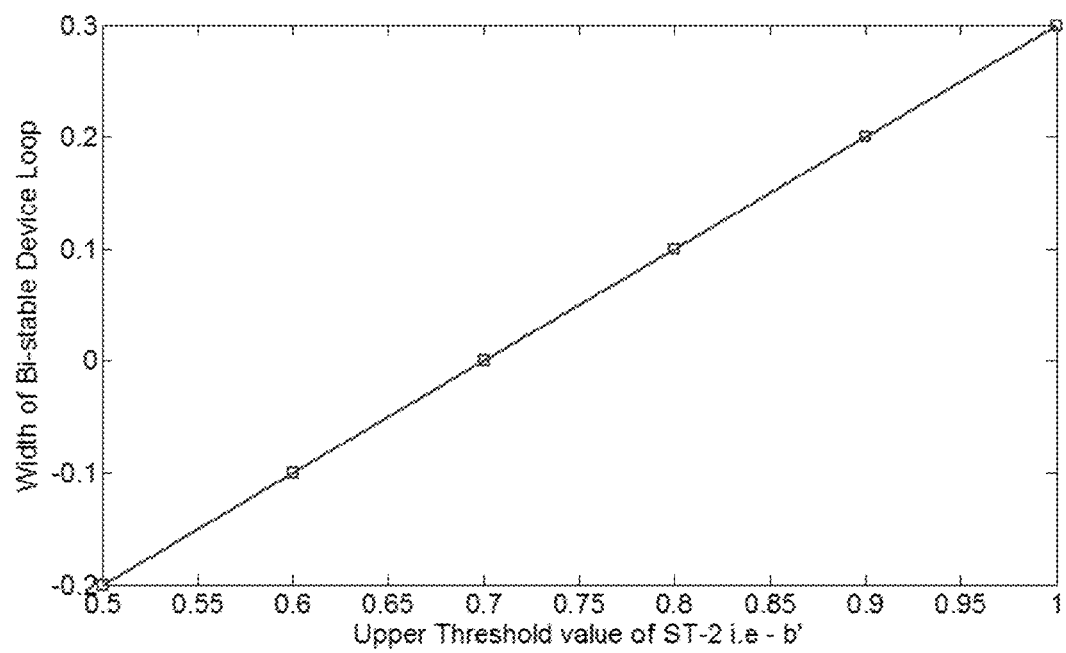
Figure 13E Effect of varying the upper threshold value of ST-2 i.e. the value - b′

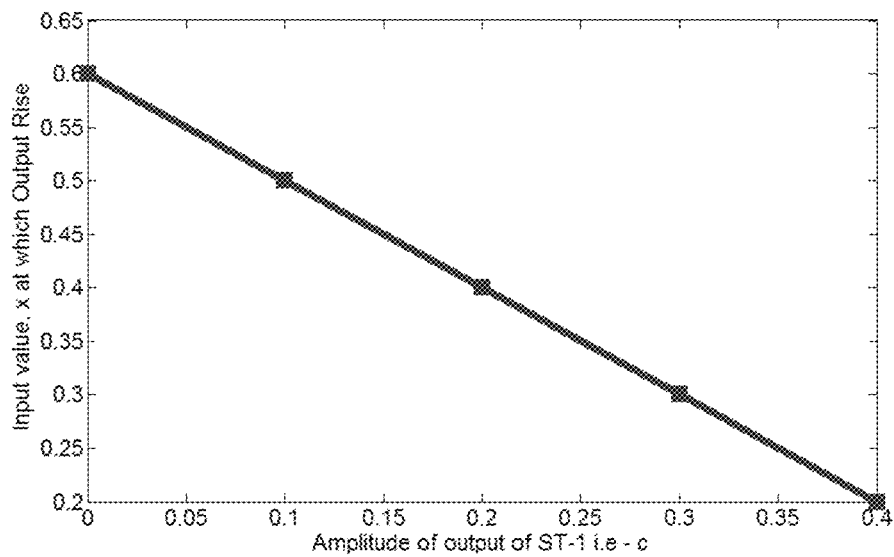
Figure 13F Effect of varying the amplitude of ST-1 i.e. 'c' on rise and fall thresholds
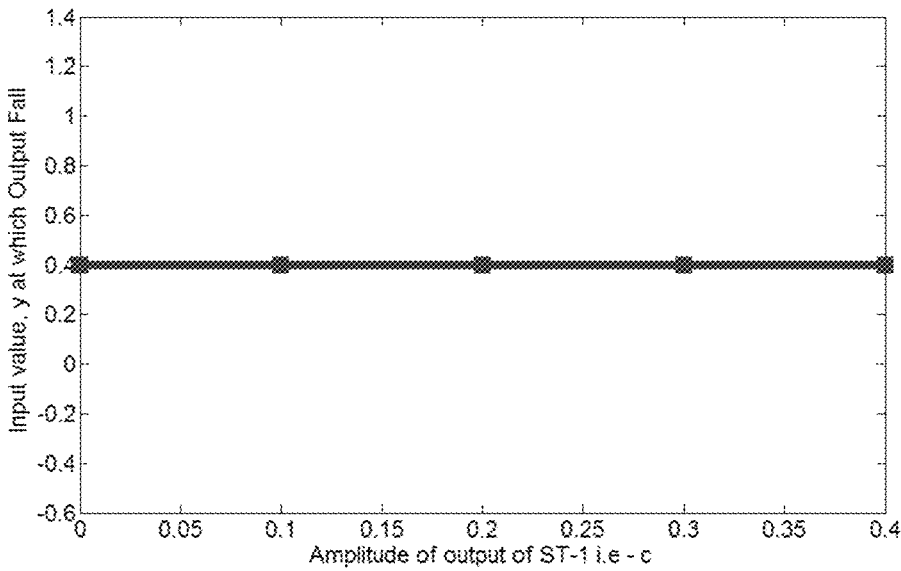
Figure 13G Effect of varying the amplitude of ST-1 i.e. 'c' on rise and fall thresholds

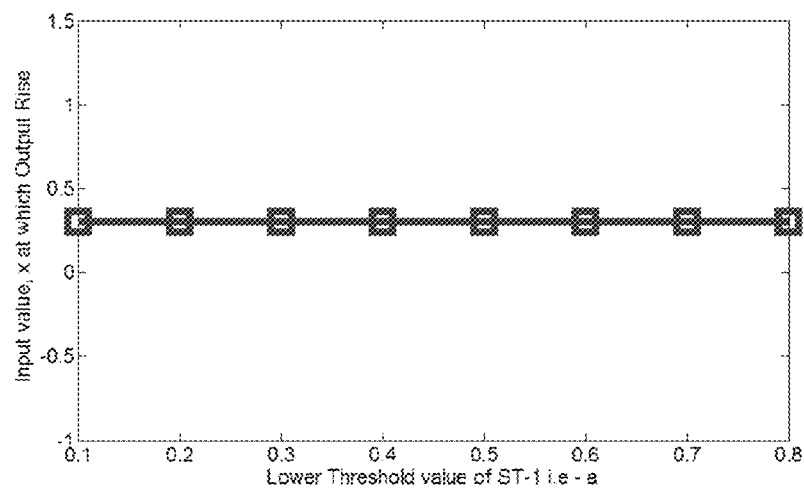
Figure 13H Effect of varying the lower threshold value of ST-1 i.e. the value - a on rise and fall thresholds
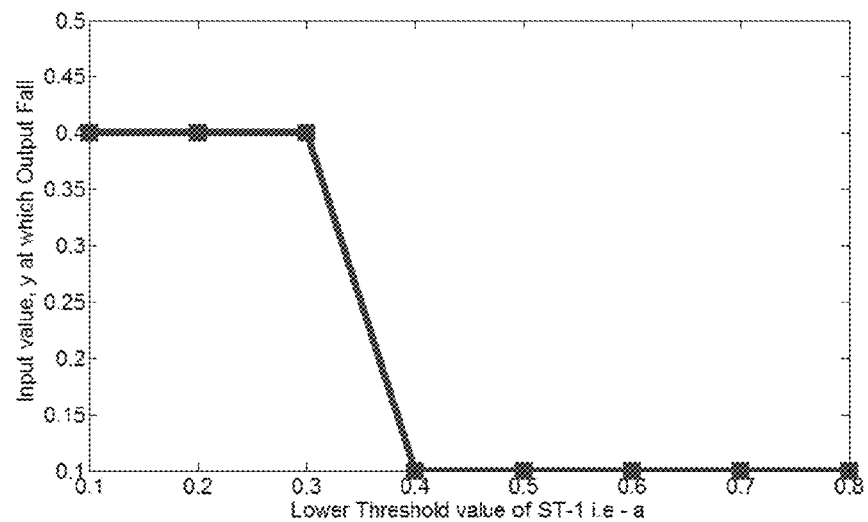
Figure 13I Effect of varying the lower threshold value of ST-1 i.e. the value - a on rise and fall thresholds

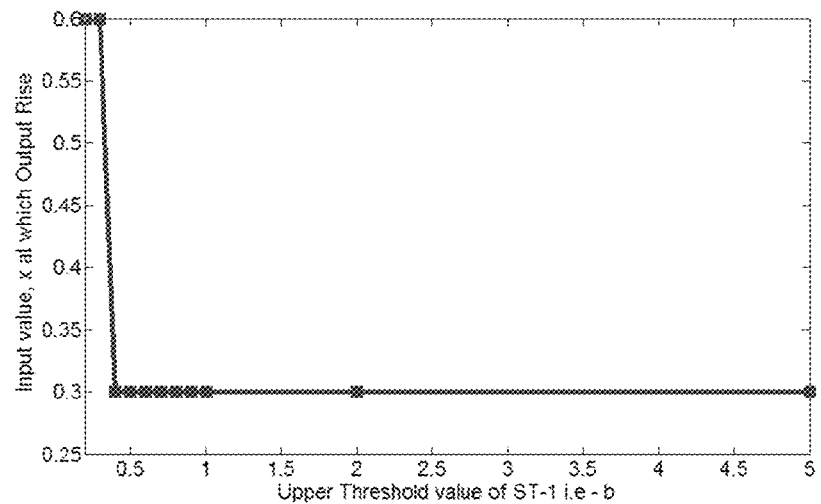
Figure 13J Effect of varying the upper threshold value of ST-1 i.e. the value - b on rise and fall thresholds
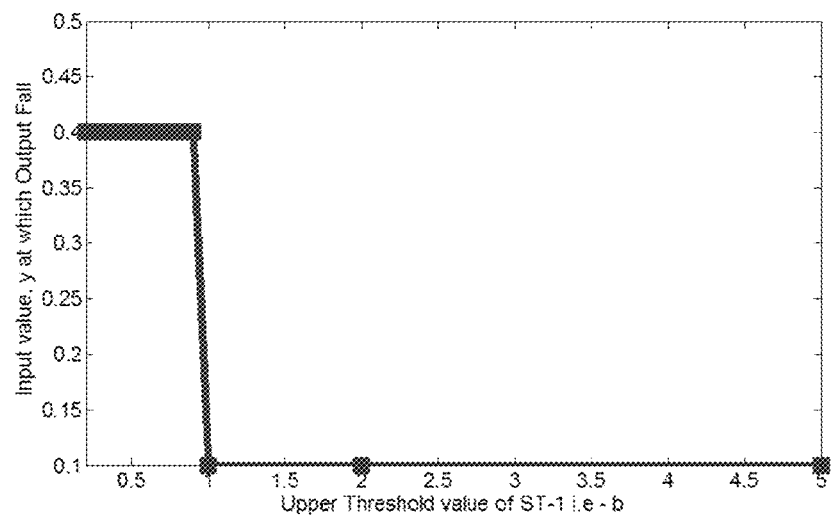
Figure 13K Effect of varying the upper threshold value of ST-1 i.e. the value - b on rise and fall thresholds

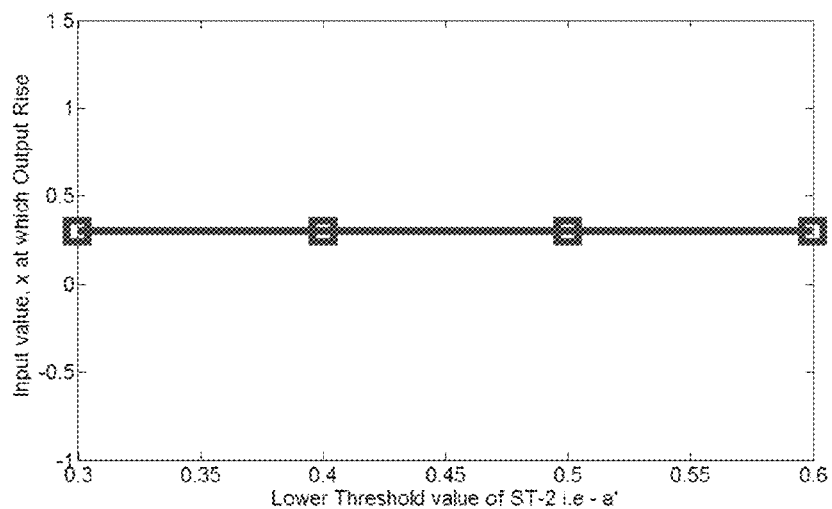
Figure 13L Effect of varying the lower threshold value of ST-2 i.e. the value - a' on rise and fall thresholds
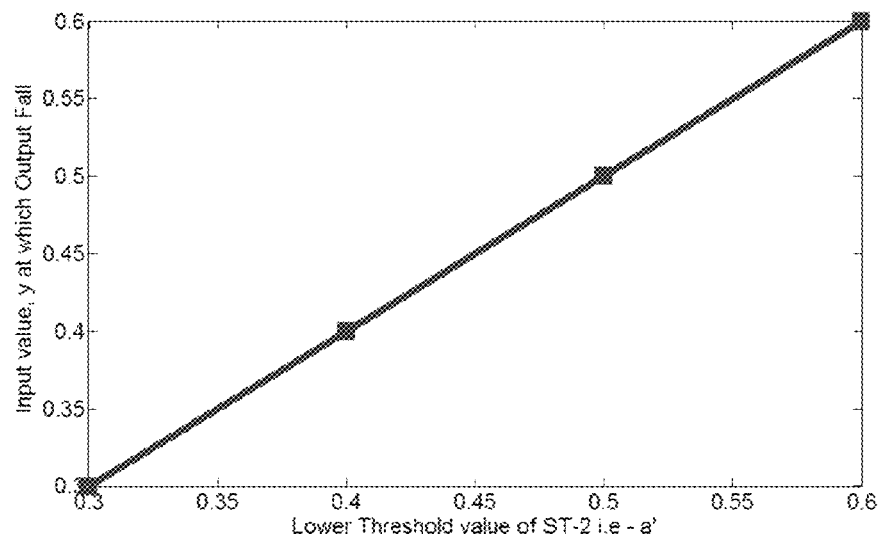
Figure 13M Effect of varying the lower threshold value of ST-2 i.e. the value - a' on rise and fall thresholds

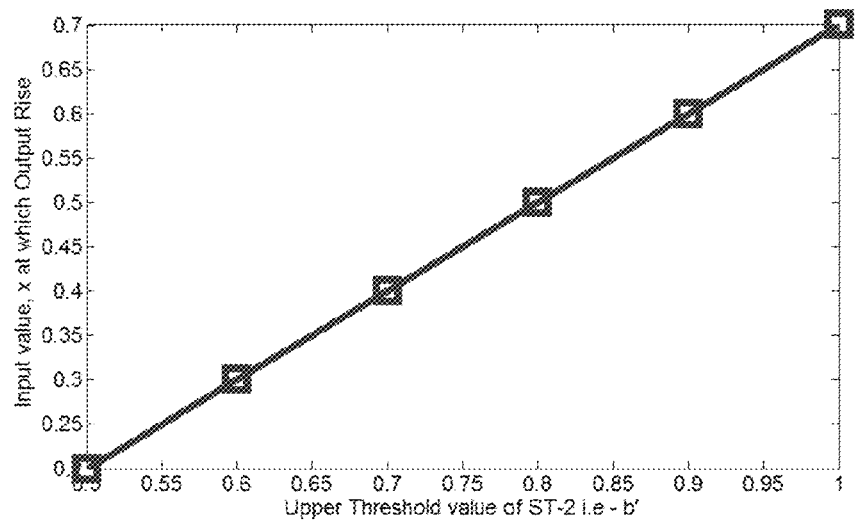
Figure 13N Effect of varying the upper threshold value of ST-2 i.e. the value - b' on rise and fall thresholds
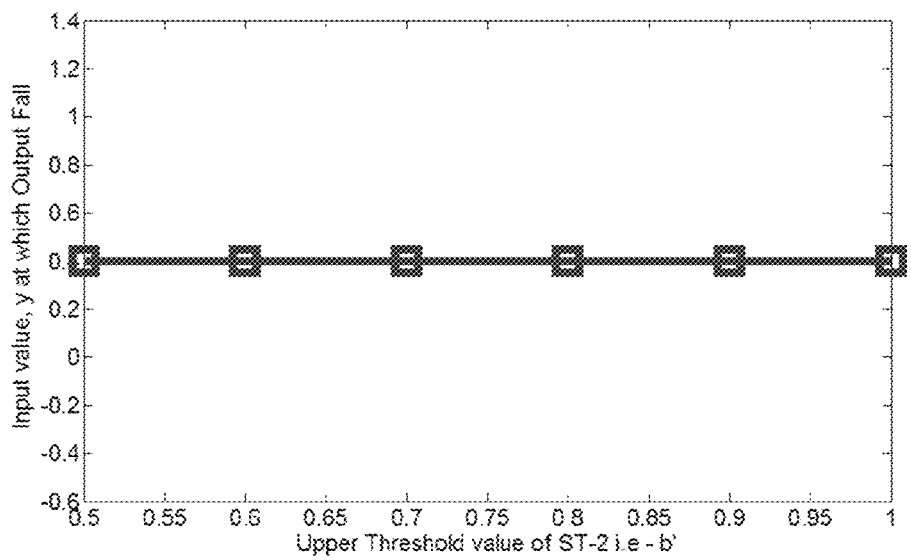
Figure 13O Effect of varying the upper threshold value of ST-2 i.e. the value - b' on rise and fall thresholds

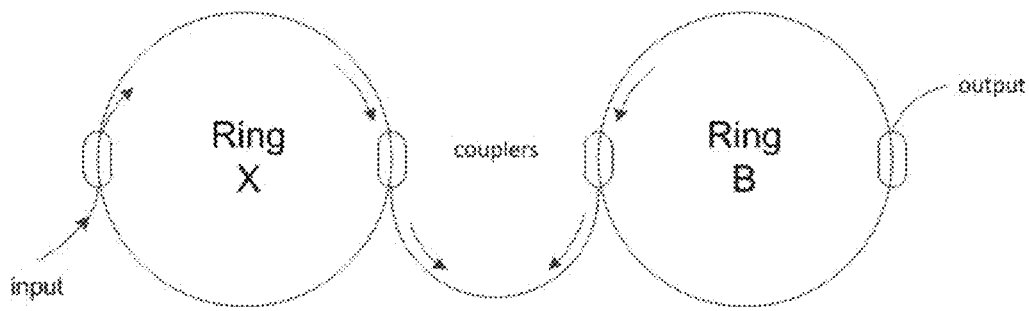
Figure 14 Design of Schmitt trigger using two ring lasers X and B
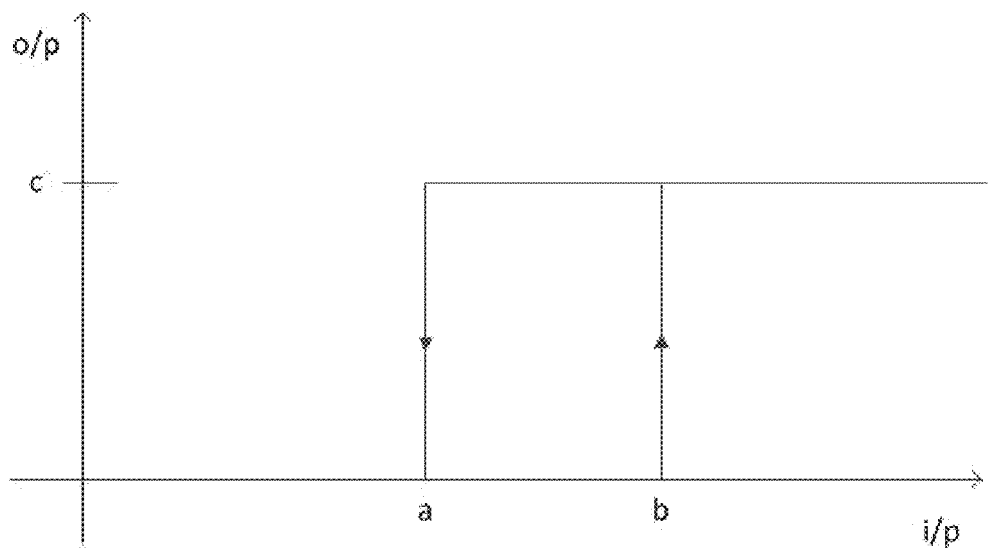
Figure 15 Transfer Function of Schmitt trigger displaying the two threshold values viz. a and b

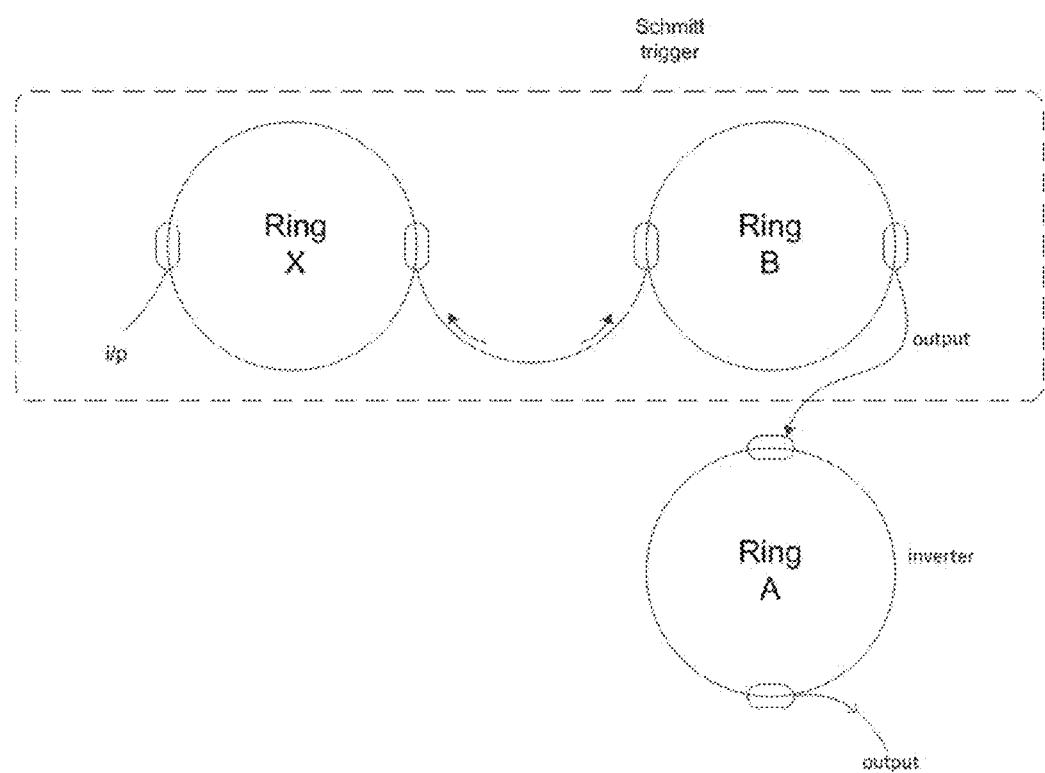
Figure 16 Inverter made of ring laser A, coupled with Schmitt trigger in order to achieve inverted output – ST-1

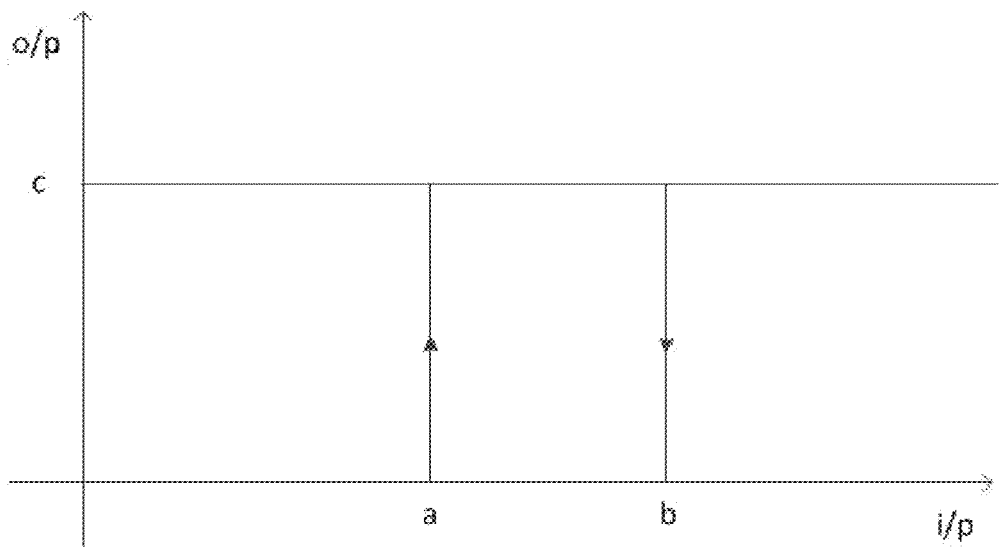
Figure 17 Transfer function of ST-1 showing inverted bi-stable device
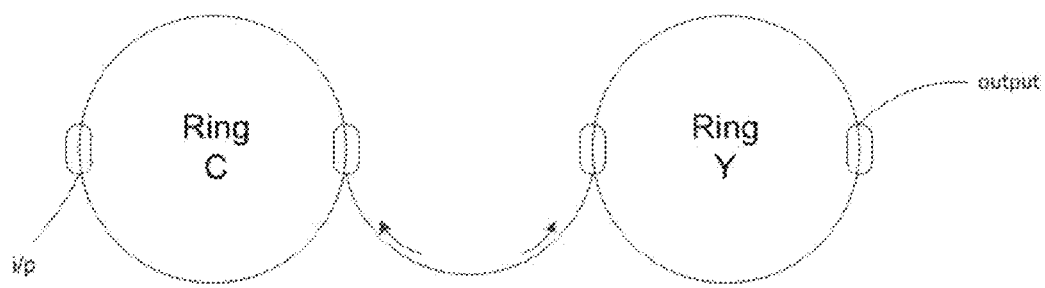
Figure 18 ST-2 made of two more rings named as C and Y

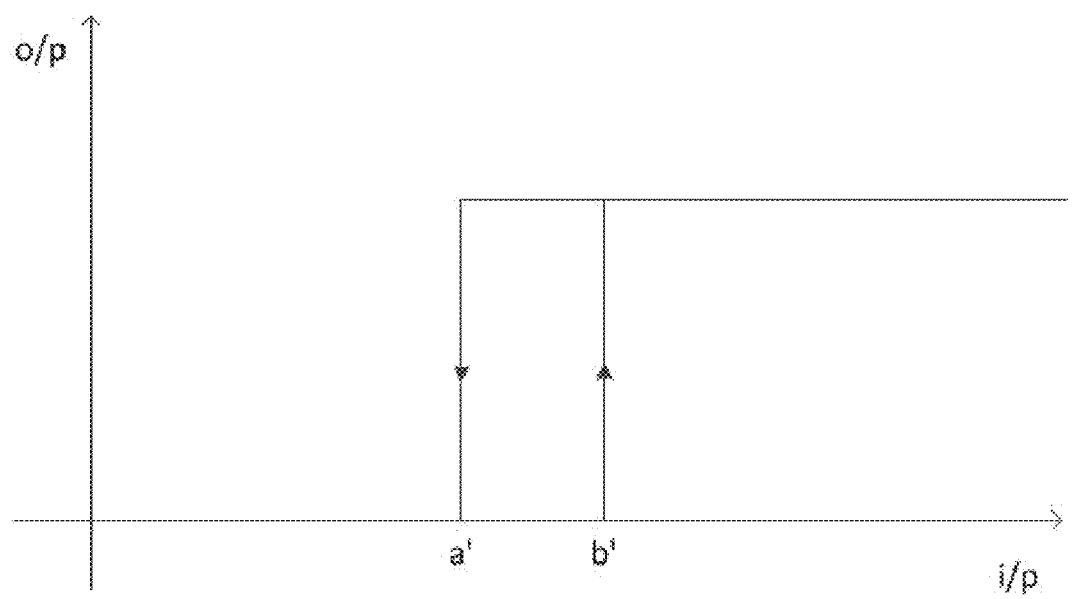
Figure 19 Transfer function of ST-2 (Non-inverting)

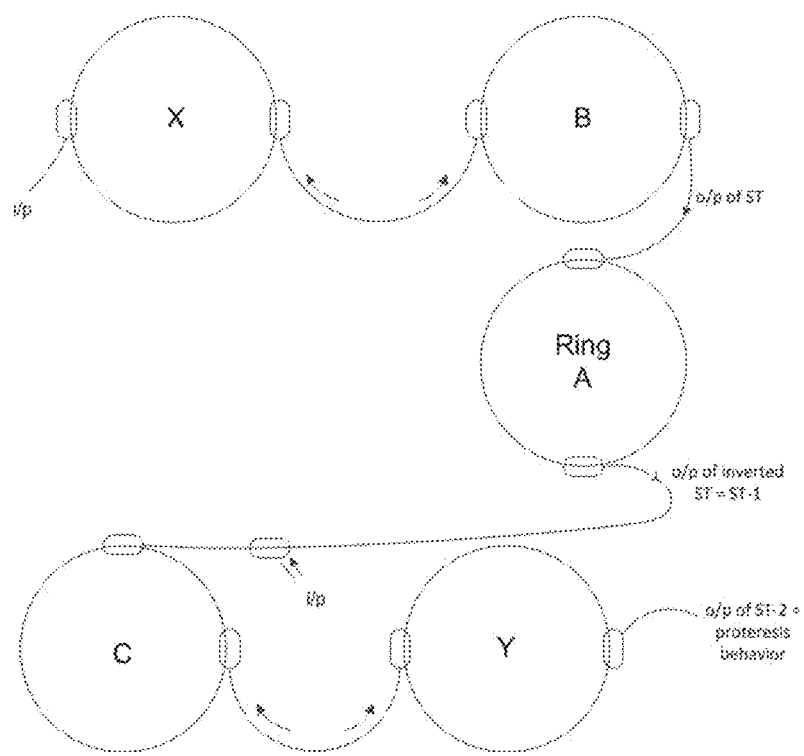
Figure 20 Complete Design of Proteresis Device using five rings
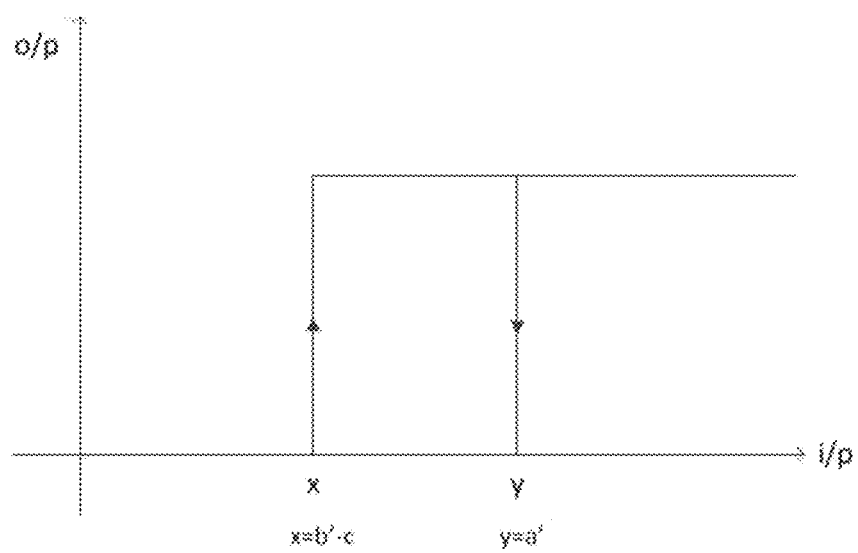
Figure 21 Transfer function of All-Optical Proteretic Device

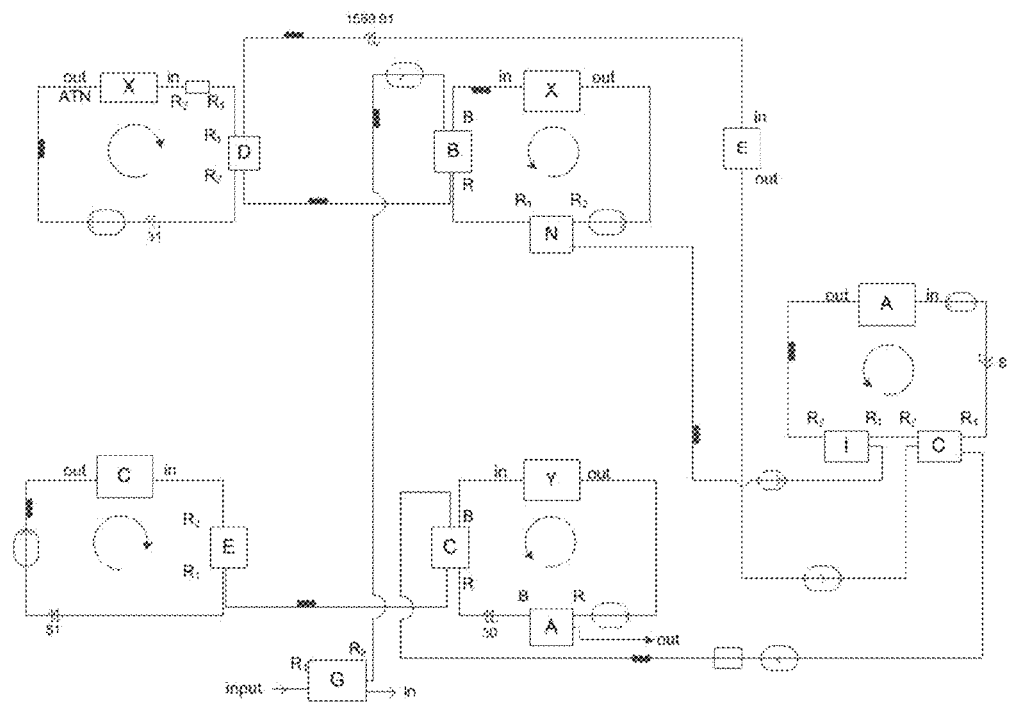
Figure 22A Demonstration Setup
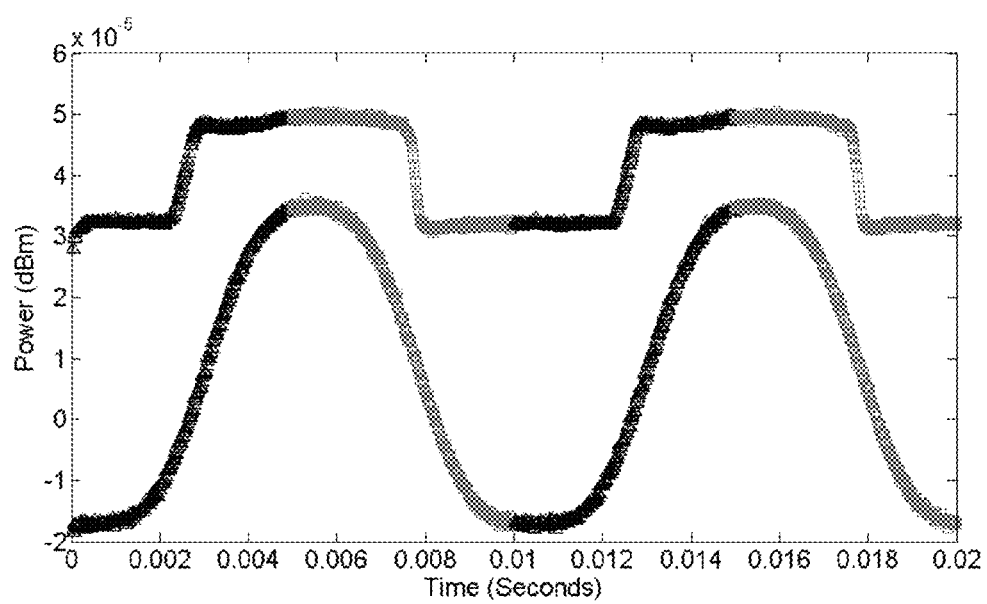
Figure 22B Experimental Results of the Proteretic Device showing time domain signal

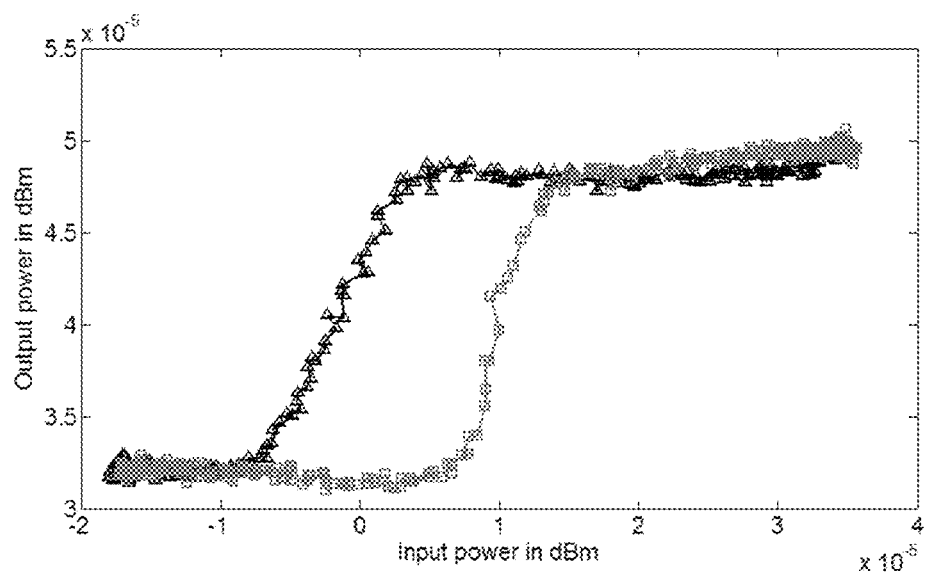
Figure 22C Experimental Results of the Proteretic Device showing transfer function
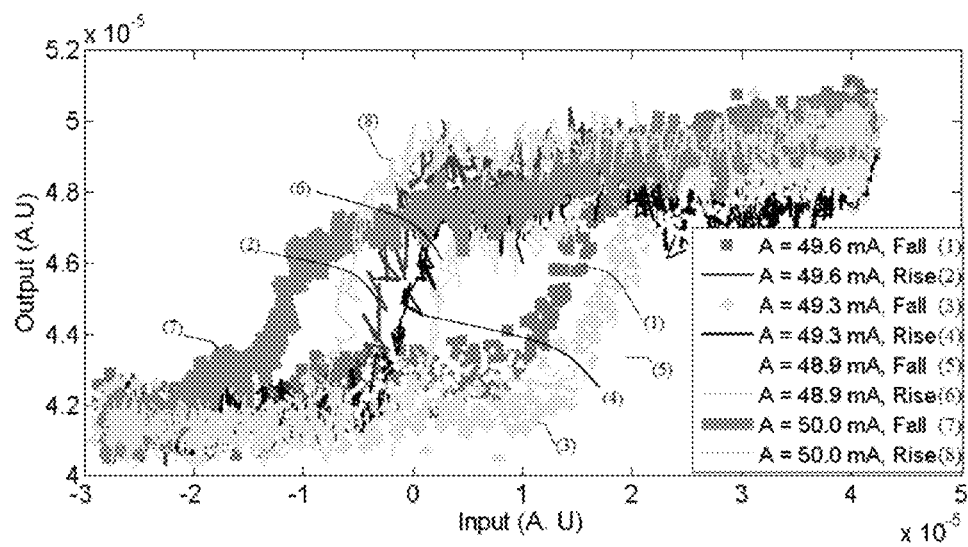
Figure 23A Effect of varying SOA current of ring laser A, i.e. varying the output of ST-1

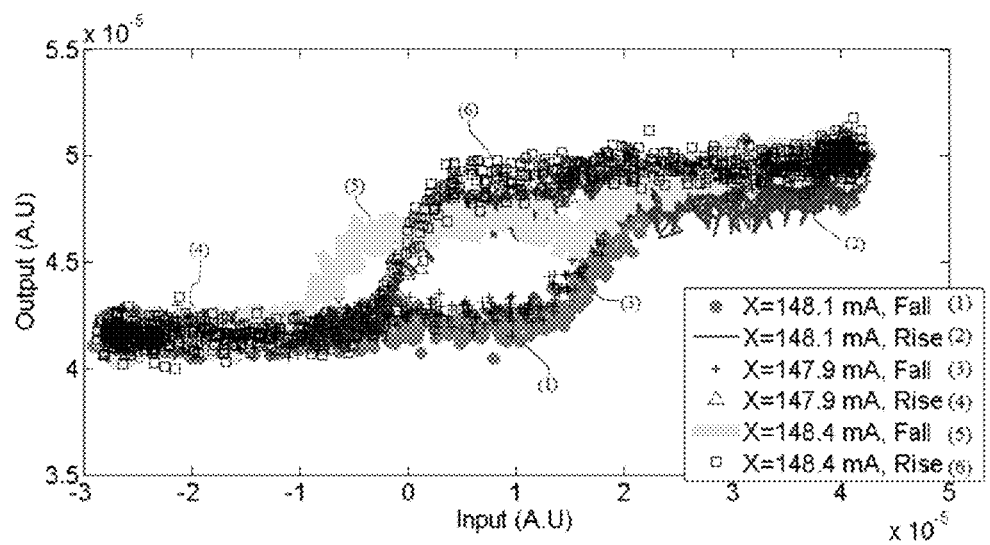
Figure 23B Effect of varying SOA current of ring laser X, i.e. varying threshold values of ST-1
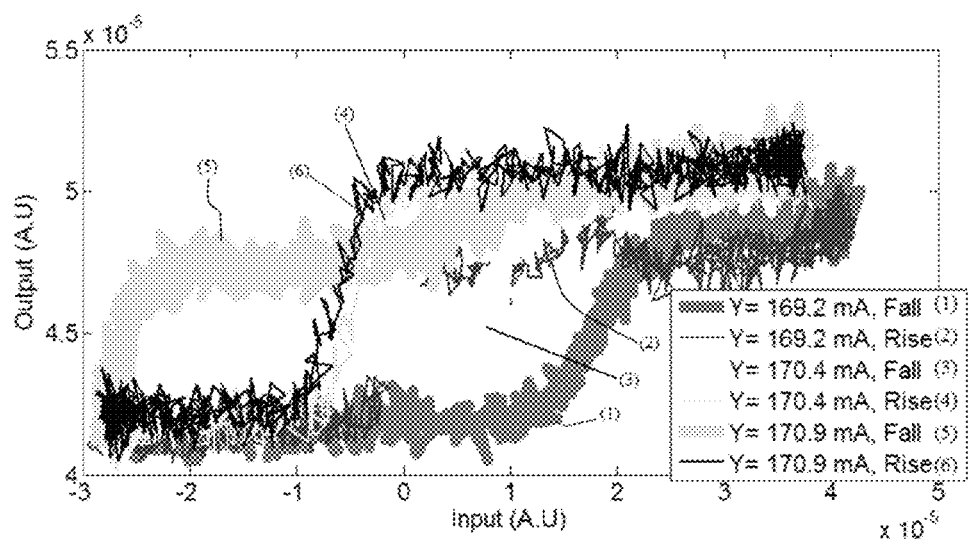
Figure 23C Effect of varying SOA current of ring laser Y, i.e. varying threshold values of ST-2

ALL-OPTICAL PROTERETIC PHOTONIC INTEGRATED DEVICE

CROSS REFERENCE

This application claims the benefit of and priority to U.S. Provisional Patent Application Ser. No. 62/187,519 entitled ALL-OPTICAL PROTERETIC PHOTONIC INTEGRATED DEVICE filed Jul. 1, 2015 and is hereby incorporated herein by reference in its entirety.

BACKGROUND

Field

This technology relates generally to photonic devices, and, more particularly, to bi-stable photonic devices.

Background

Hysteresis has been observed in nature including ferromagnetic materials, crayfish receptors, and vertebrates. Also, hysteresis has applications in electronics such as Schmitt trigger device applications for reducing noise in signals. Proteresis has few appearances in literatures. Some examples are Prussian blue analogs, a magnetic polaron model, and magnetism of TiO2 clusters. A CMOS transition accelerator with proteresis has also been designed.

The hysteretic bi-stable device can be useful for regeneration of clean binary signals from noisy signals; however, the hysteretic bi-stable device delays the threshold function operation proportional to the hysteresis loop width and the conversion response time from the rate equations in semiconductor optical amplifiers (SOAs). A bi-stable device is a device that is like a switch in that it can only be in two possible stable states (bistability), for example "on" or "off". In some systems, such as with binary delta-sigma modulators, a bi-threshold device is needed to prevent unwanted noise. The delay due to the hysteresis loop and SOA carrier life-time reduces their modulation rates; hence a new bi-threshold (bi-stable) device is needed with no delay or better yet negative delay which compensates the overall conversion time of the bi-stable device.

BRIEF SUMMARY

The technology as disclosed and claimed is a design (simulated via VPIphotonics™ and optical implemented for proof of concept) of an all-optical proteretic bi-stable device, whereby one implementation of the device can include an all optical bi-stable circuit configured using two coupled ring lasers. The proteresis is a reversed hysteresis with an interesting characteristic which increases the oscillation frequency of a feed-back system with a relaxation dynamic by reducing the feed-back delay. The calculation of the bi-stable device parameters, a simulation of the theoretical device, and a simulation of the all-optical device are given. Applications of the proteretic device in ultra-high speed oscillations are also described herein.

Hysteretic triggering responds after the device threshold is reached, on the other hand, the proteretic triggering responds before the threshold is reached in both sweep directions. This characteristic of proteresis can enhance and accelerate the dynamics of the system in where the trigger is embedded unlike the hysteretic one which may introduce undesirable delay. Fast functionality and at the same time maintaining the noise immunity are the intrinsic properties of the proteretic triggering. The characteristic of proteresis has not been fully leveraged for electronic or electro-optical photonic devices.

One implementation of the technology as disclosed herein is a bi-stable device, which includes an input and an output of an inverting bi-stable device having a hysteretic threshold function, where the input and output are coupled to an input of a bi-stable device having a hysteretic threshold function. The coupling of the two hysteretic devices in this manner creates a proteretic bi-stable device (or a reversed hysteresis device). Switching for this bi-stable device occurs when a lower threshold is reached in an increasing direction of an input signal and when an upper threshold is reached in a decreasing direction of the input signal. The above inverting bi-stable device having the hysteretic function and the bi-stable device to which it is coupled can both be bi-stable electronic semiconductor devices.

Another implementation of the technology as disclosed and claimed herein can be where the inverting bi-stable device having the hysteretic function and the bi-stable device to which it is coupled are both bi-stable optical devices. The bi-stable device as described can be included as a switching device for an oscillator to thereby increase an oscillation rate of the oscillator without increasing an integration intrinsic speed of the oscillator.

Yet another implementation can include a bi-stable device as recited and discussed herein, where the bi-stable device is included as a switching device for a delta-sigma modulator to thereby increase a modulation rate for the delta-sigma modulator. The technology can also be included as a switching device for a stable dynamical system to thereby increase the relaxation rate without increasing an intrinsic rate. Further the technology can be included as a switching device for any artificial neural network with feedback, for example Hopfield network (a form of a recurrent artificial neural network that serves as content addressable in memory systems), to thereby increase the convergence rate without increasing an intrinsic rate, in particular.

The bi-stable device technology as disclosed and claimed can be operated as a reversed Schmitt trigger. The bi-stable device as recited can be included as a switching device for an optical oscillation device. The inverting bi-stable device having the hysteretic function and the bi-stable device to which it is coupled can both be semiconductor ring lasers. The technology can also be operated as a reversed Schmitt trigger.

Supportive of the design, a simulation (via VPIphotonics software) of an all-optical proteretic bi-stable device can be performed as outlined herein for proof of concept. First an optical hysteretic bi-stable device is reviewed and discussed. An optical implementation of the proteretic bi-stable device is then discussed. The simulation results and applications of the device are also provided herein.

These and other advantageous features of the present invention will be in part apparent and in part pointed out herein below.

BRIEF DESCRIPTION OF THE DRAWINGS

For a better understanding of the present invention, reference may be made to the accompanying drawings in which:

FIG. 9 is an illustration of Proteretic device using two bi-stable devices;

FIG. 10 is an illustration of transfer function of inverting and non-inverting Schmitt triggers viz. ST-1 and ST-2;

FIG. 11 is an illustration of a design of proteretic Device using Schmitt Triggers in Simulink Matlab;

FIGS. 12A and 12B are results of the Proteretic Device showing time domain signal and transfer function;

FIGS. 13A through 13O illustrates the effect of varying parameters of ST-1 and ST-2;

FIG. 14 is an illustration of a design of Schmitt trigger using two ring lasers;

FIG. 15 is an illustration of a transfer Function of Schmitt trigger displaying the two threshold values;

FIG. 16 is an illustration of an inverter made of ring laser A, coupled with Schmitt trigger in order to achieve inverted output—ST-1;

FIG. 17 is an illustration of a transfer function of ST-1 showing an inverted bi-stable device;

FIG. 18 is an illustration of ST-2 made of two more rings;

FIG. 19 is an illustration of a transfer function of ST-2 (Non-inverting);

FIG. 20 is an illustration of a design of a proteresis device using five rings;

FIG. 21 is an illustration of a transfer function of an All-Optical Proteretic Device;

FIGS. 22A through 22C is an illustration of the demonstration setup and Experimental Results of the Proteretic Device; and FIGS. 23A through 23C illustrates the effect of varying SOA.

Figure 1:
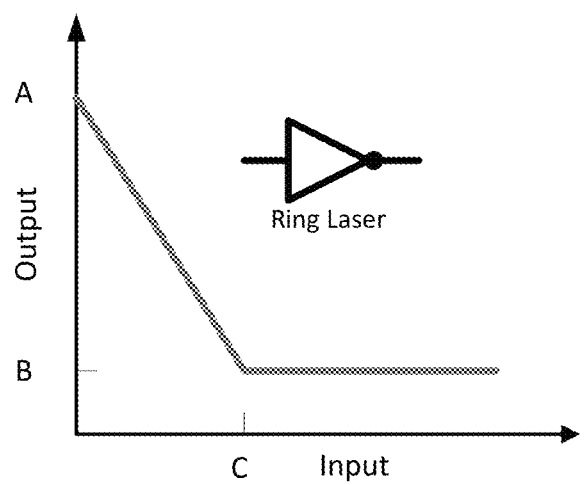
FIG. 1 is Input/output relationship for a ring laser as inverted amplifier.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF INVENTION

According to the embodiment(s) of the present invention, various views are illustrated in FIGS. 1-24 and like reference numerals are being used consistently throughout to refer to like and corresponding parts of the invention for all of the various views and figures of the drawing. Also, please note that the first digit(s) of the reference number for a given item or part of the invention should correspond to the Fig. number in which the item or part is first identified.

One embodiment of the present technology comprising a proteretic device teaches a novel apparatus and method for an all-optical proteretic bi-stable device designed to address some of the shortcomings of traditional hysteretic bi-stable devices.

Figure 2:
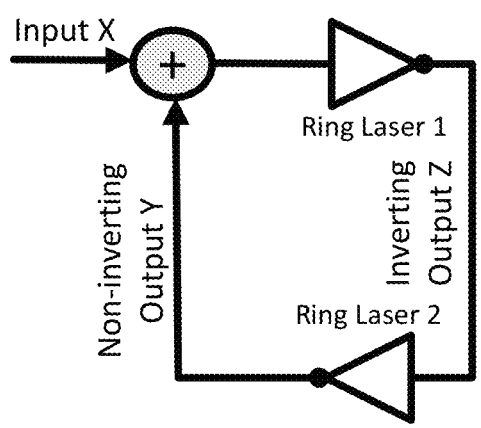
FIG. 2 is Architecture of a bi-stable device using two inverting amplifiers (ring lasers)
Figure 3:
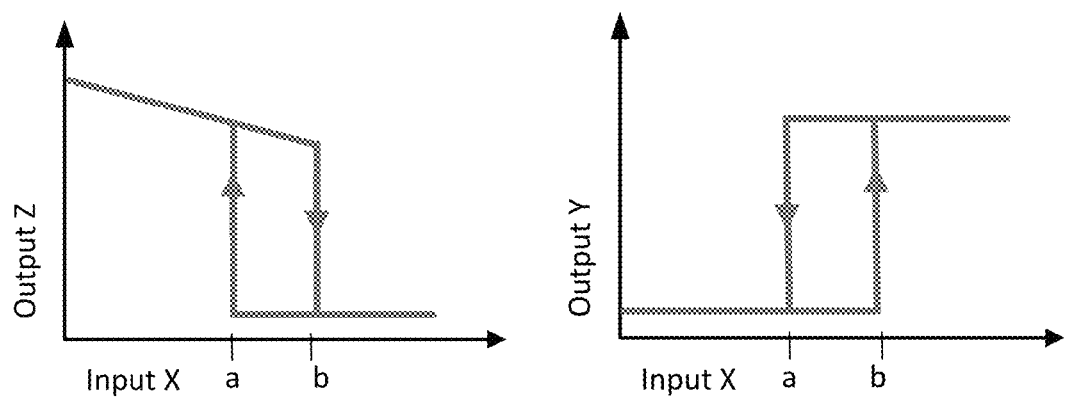
FIG. 3 is Input/output relationships for inverting and non-inverting hysteretic bi-stable devices.

A hysteretic bi-stable device can be designed using two coupled ring lasers. Other approaches can also be used for bi-stability. Each ring laser can act as an inverting amplifier as illustrated in FIG. 1. All parameters A, B, and C can be defined through the device parameters. The coupled rings geometry is illustrated in FIG. 2. Each laser can support a different wavelength. FIG. 3 illustrates the input/output relations for the inverting and non-inverting operations. The forward-threshold b and the backward-threshold a can be derived as:

$$a = \frac{A_1 - B_1}{m_1} + m_2 B_1 - A_2 \text{ and } b = \frac{B_2 - A_2}{m_1 m_2} + \frac{A_1}{m_1} - B_2 \text{ where}$$

$$m = \frac{B-A}{C},$$

indices 1 and 2 refer to Ring 1 and Ring 2, respectively. The lines representing the on state are:

$Z=-m_1(X+B_2)+A_1$ for the inverting device $Y=-m_2 B_1 + A_2$ for the non-inverting device.

The lines representing the off state are:

$Z=B_1$ for the inverting device $Y=B_2$ for the non-inverting device.

The hysteretic bi-stable device can be useful for regeneration of clean binary signals from noisy signals; however, the hysteretic bi-stable device delays the threshold function operation proportional to the hysteresis loop width and the conversion response time from the rate equations in semiconductor optical amplifiers (SOAs). In some systems, such as with binary delta-sigma modulators, a bi-threshold device is needed to prevent unwanted noise. The delay due to the hysteresis loop and SOA carrier life-time reduces their modulation rates; hence a new bi-threshold (bi-stable) device is needed with no delay or better yet negative delay which compensates the overall conversion time of the bi-stable device. The technology as disclosed and claimed provides such a device, namely a proteretic bi-stable device. This device, unlike a hysteretic device, has "negative" delay in comparison with a similar hysteretic bi-stable device, and reduces delay due to the relaxation dynamics in the system, hence increases the modulation rate and other dynamics that the system is involved in. The word proteresis means forward in time as oppose to hysteresis, backward in time.

Figure 4:
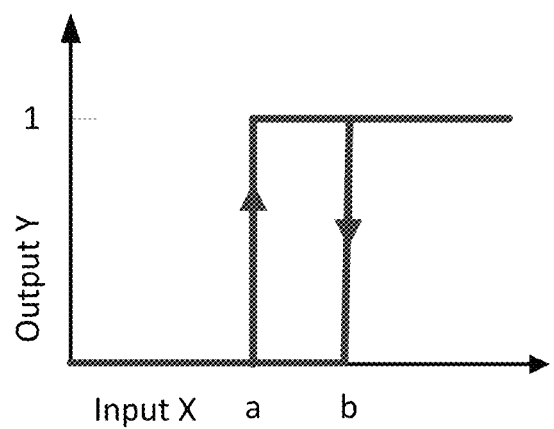
FIG. 4 is Input/output relationship for proteretic bi-stable device.
Figure 5:
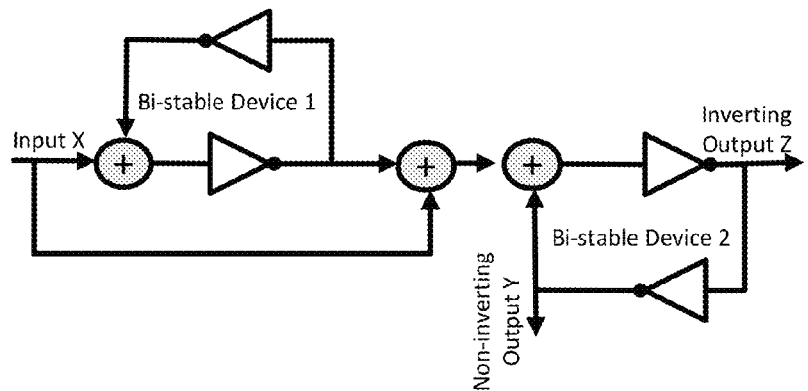
FIG. 5 is Architecture of a proteretic bi-stable device.

An input/output relationship for a non-inverting proteretic bi-stable device is illustrated in FIG. 4. An illustration of the proteretic bi-stable device using ring lasers similar to the hysteretic one discussed earlier is provided in FIG. 5. The threshold values for both bi-stable devices are given below. The index 1 (2) corresponds to the device 1 (2). The on-value and the off-value are normalized to unity and zero, respectively.

$a_1=a$, $b_1=b$, $a_2=b$, and $b_2=1+a$

Figure 6:
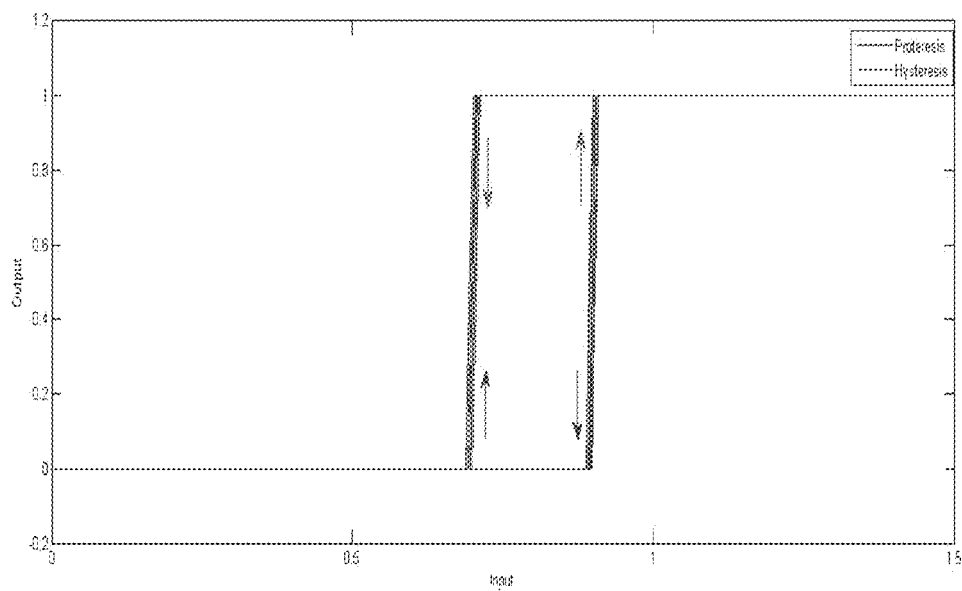
FIG. 6 is Input/output relationship for Matlab® simulation of proteretic and hysteretic devices.

An input/output relationship using a Matlab® simulation of proteretic and hysteretic devices is shown in FIG. 6. The threshold values are:

$a_1=0.7$, $b_1=0.9$, $a_2=0.9$, and $b_2=1.7$.

In this simulation to demonstrate the efficacy of the technology, the relay function in Simulink can be used for a hysteretic bi-stable device. This results in the flat-top functions that are shown in FIG. 6. Both devices have almost identical threshold values except the directions. The hysteretic curve in FIG. 6 is from the bi-stable device 1 shown in FIG. 5.

Figure 7:
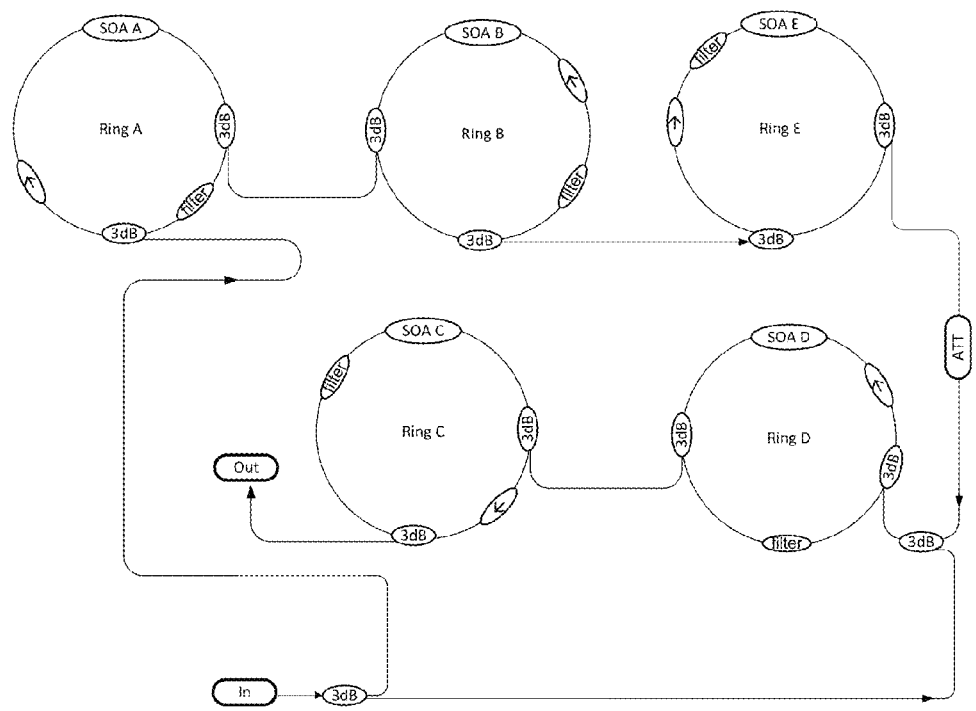
FIG. 7 is An optical implementation of the proteretic device using VPIphotonics simulation software.
Figure 8:
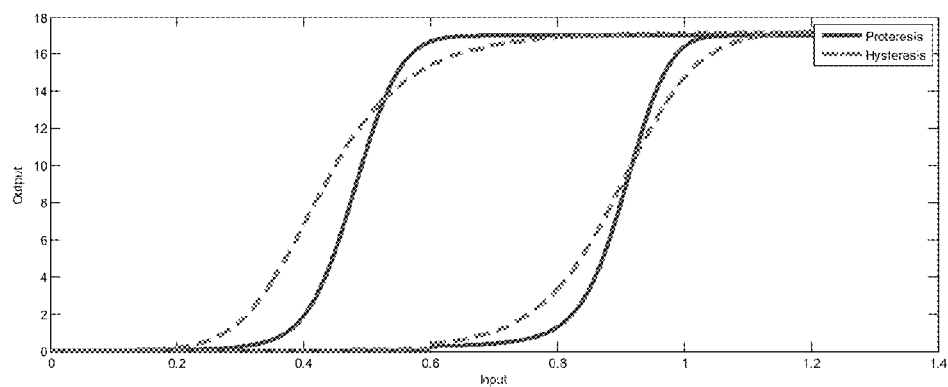
FIG. 8 is Input/output relationships of hysteretic and proteretic devices using VPIphotonics simulation software.

A VPI photonics simulation diagram of the proteretic device is shown in FIG. 7. Rings A (C) and B (D) are to implement the bi-stable device 1 (2) in FIG. 5. Ring E inverts and amplifies the output of Ring B. The attenuator (ATT) then adjusts the intensity level to an appropriate level for overall operation of the device. All ring lasers are unidirectional with appropriate wavelengths. All couplers are 3 dB type. Input/output relationships of both hysteretic and proteretic devices are shown in FIG. 8. The proteretic curve has a slight steeper slope in comparison with that of the hysteretic one, caused by the cascading of the two bi-stable devices.

In this simulation to demonstrate the technology, all SOAs can be chosen to be identical, where the SOA parameters are: device section length is 350 um; active region width is 2.5 μm; active region thickness is 200 nm; confinement factor is 0.3; bimolecular recombination rate is $$10^{-16} \frac{m^5}{s};$$

and Auger recombination rate is $$1.3 \times 10^{-41} \frac{m^6}{s}.$$

The SOA currents (wavelengths) are: SOA-A=90 mA (1549.6 nm), SOA-B=86 mA (1542.4 nm), SOA-C=83 mA (1542.4 nm), SOA-D=90 mA (1549.6 nm), and SOA-E=90 mA (1547.2 nm). The output of SOA E is attenuated by 4 dB in order to be in the same order as input signal.

The proteretic bi-stable device can behave as a predictive element because it switches before the threshold is reached in both increasing and decreasing directions of the input. This characteristic of the device has applications in enhancing the system dynamics where an oscillation or a stable relaxation occurs due to switching. An example is an oscillator that consists of a switching device and an integrator in a feedback loop. The oscillation rate can be increased by applying the proteretic property to the switching device without increasing the integration speed.

An ultra-fast delta-sigma modulator may benefit from the proteretic device where the switching device is replaced with the proteretic one to enhance the modulation rate. Another application is in controlling the hysteretic loop width by pipelining a proteretic device in parallel with the hysteretic one.

The technology as disclosed herein, provides an architecture and its optical realization as presented for a proteretic (reversed-hysteretic) bi-stable device. This device has a potential to benefit the ultra-high speed optical oscillation devices where a hysteretic switching mechanism is replaced with the proteretic one. This kind of switching may be visualized as a predictive or proactive switching. The optical realization of the device was based on the coupled ring lasers. The device was simulated via VPI photonics software in which it was in close agreement with the theory.

For the purpose of this disclosure the definition of Proteresis can be defined as reverse hysteresis. Unlike hysteresis, there is a delay between two thresholds, in Proteresis there is promotion between the two thresholds i.e. the upper threshold reaches before the lower threshold. In Greek, hysteresis means "which comes after," while "Proteresis," symmetrical word, means "which comes earlier". This effect of Proteresis can be implemented with the help of two hysteretic devices—one inverting and the other non-inverting or inverting. The design of the Proteretic device can be seen in FIG. 9 using as few as only two bi-stable devices such as Schmitt triggers.

Let the two thresholds of inverting bi-stable device named as ST-1 in FIG. 9 be 'a' and 'b'. Let the amplitude of the output coming out of ST-1 be "c". Also, denoting the thresholds of non-inverting bi-stable device named as ST-2 in the FIG. 9 as 'a'' and 'b''. Therefore the transfer functions of both the hysteretic devices look like as shown in FIG. 10. Following are the necessary conditions in order to achieve the Proteresis:

1. $a<a'<b$     (1)

Equation (1) defines the condition for lower threshold value of ST-2 in relation with the threshold values 2. $c+a<b'<c+b$     (2)

Equation (2) defines the condition for upper threshold value of ST-2 in relation with the threshold values and amplitude of ST-1

3. $b'-a'<c$     (3)

Equation (3) defines the width of hysteresis loop of ST-2
The design and simulation, satisfying the above necessary conditions can be done on Simulink Matlab shown in FIG. 11.

The normalized values assigned to the threshold parameters satisfying the above conditions were as follows:—a=0.2; b=0.8; c=0.3; a'=0.4; and b'=0.6. Results from the Simulink are presented in FIG. 12.

In order to estimate the range of values of the thresholds and output of ST-1 in order to work as a Proteretic device, a study has been done by
1. Varying the amplitude of output of ST-1; keeping the thresholds of ST-1 and ST-2 constant
2. Varying the threshold values of ST-1; keeping the amplitude of its output and ST-2 threshold constant
3. Varying the threshold values of ST-2; keeping the amplitude of ST-1 output and ST-2 threshold constant The effect of varying the values of 'c', 'a', 'b', 'a'', 'b'' has been studied by plotting the width of bi-stable loop i.e. the difference between upper and lower thresholds respectively. Therefore, the positive width can be referred to as that of hysteretic loop and negative width as that of Proteretic loop. Results of the above study are shown in FIG. 13. From the results of FIG. 13, the following observations can be made in addition to the necessary conditions mentioned earlier in this report in order to achieve thicker Proteretic loop.
1. The amplitude of the output of ST-1 (i.e. 'c') should be kept close to the value of upper threshold of ST-2 (i.e. 'b'') but not so close that condition-2 fails.
2. The hysteresis loop of the ST-2 should be as minimum (thin) as possible i.e. a'−=b'. The width of Proteresis loop=c−(b'−a'), hence the maximum width of the Proteresis would be equal to the amplitude of output of ST-1 which would be achieved at a'=b'.

With the technology as disclosed, the effect of Parameters on rising and falling edge thresholds of final output can be observed. If 'x' and 'y' are the input values at which output rise and fall respectively, the effect of those five parameters on x and y can be observed.

It can be observed that

1. The rising edge threshold of bi-stable device decrease linearly with increase in 'c'. The falling edge is constant and does not vary with it.
2. The falling edge threshold of bi-stable device switches non-linearly with increase in 'a'. The rising edge is constant and does not vary with it.
3. Both rising and falling edge thresholds switch non-linearly with increase in 'b'.
4. The falling edge threshold of bi-stable device increase linearly with increase in 'a''. The rising edge is constant and does not vary with it.
5. The rising edge threshold of bi-stable device increase linearly with increase in 'b''. The falling edge is constant and does not vary with it.

With the above mentioned design, simulations, results and observations, a step-by-step procedure to design a Proteretic device can be proposed.

Step 1—A bi-stable device can be designed for example a Schmitt trigger as previously illustrated. Let 'a' be its lower threshold and 'b' be its upper threshold. This can be achieved in an all-optical domain using two semiconductor ring lasers as shown in FIG. 14 and its transfer function is shown in FIG. 15.

Step 2—Connect the output of the Schmitt trigger designed in step-1 to an inverter in order to achieve inverted bi-stable device (Name it as ST-1). The inverting action can be achieved using a one ring laser. The ST-1 design is shown in FIG. 16 and its transfer function is shown in FIG. 17. Note down the amplitude of its output, let it be denoted by 'e'.

Step 3—Design another Schmitt trigger (Name it as ST-2) with 'a'' and 'b'' as lower and upper thresholds respectively shown in FIG. 18. This also can be achieved by using two semiconductor ring lasers as done previously in step 1. The transfer function of this ST-2 is shown below in FIG. 19:

Step 4—Therefore, an inverting bi-stable device (ST-1) can be achieved using three ring lasers and a non-inverting bi-stable device (ST-2) has been achieved using two ring lasers. The next step is to have control on their threshold values and the amplitude of inverters output in such a way that the two necessary conditions mentioned earlier in this report and is presented again here are satisfied. The concept is to pre-condition ST-2 with the output of ST-1 in order to achieve Proteresis. The control on amplitude and threshold values can be achieved with the help of injection currents of ring lasers [2].

1. $a < a' < b$        (1)

Equation (1) defines the condition for lower threshold value of ST-2 in relation with the threshold values and amplitude of ST-1

2. $c+a < b' < c+b$        (2)

Equation (2) defines the condition for upper threshold value of ST-2 in relation with the threshold values and amplitude of ST-1

3. $b'-a' < c$        (3)

Equation (3) defines the width of hysteresis loop of ST-2

In order to increase the width of Proteresis loop, the following techniques can be applied:
1. The amplitude of the output of ST-1 (i.e. 'c') can be kept close to the value of upper threshold of ST-2 (i.e. 'b'') but not so close that condition-2 fails.
2. The hysteresis loop of the ST-2 can be as minimum (thin) as possible i.e. a'-=b'. The width of Proteresis loop=c-(b'-a'), hence the maximum width of the Proteresis would be equal to the amplitude of output of ST-1 which would be achieved at a'=b'.
3. Step 5—After achieving above conditions, connect the two bi-stable as shown in the FIG. 20 devices in order to work as Proteretic device. The transfer function being shown in FIG. 21. The new threshold values x and y can be evaluated as x=b'-c and y=a'. We can observe that the ST-2 has been pre-condition with output of ST-1 helping it to switch before its actual b' value.

The experimental setup that can be used to demonstrate the Proteretic Device is shown in FIG. 22A:

The experimental results of the all-optical Proteretic Device are shown in FIG. 22B. The SOA currents of each ring are mentioned below:

$I_B = 179$ mA; $I_X = 185.9$ mA; $I_A = 45.7$ mA; $I_C = 271$ mA; $I_Y = 174.5$ mA; and $I_E = 101.4$ mA.

A 10 dBm, 1559.91 nm laser is modulated using EoM with 100 Hz signal.

In order to estimate the range of permissible SOA currents which effect the threshold values of ST-1, ST-2 and output of ST-1, a study has been done and the results are shown in FIG. 23.

1. Varying the SOA current of ring laser A which is like changing the amplitude of output of ST-1
2. Varying the SOA current of ring laser X which is like changing the threshold values of ST-1
3. Varying the SOA current of ring laser Y which is like changing the threshold values of ST-2

The ring laser currents are as follows:

$I_B = 203$ mA; $I_X = 148.1$ mA; $I_A = 49.6$ mA; $I_C = 321$ mA; $I_Y = 169.2$ mA; and $I_E = 100.2$ mA.

Observations:
1. FIG. 23A shows the effect of varying SOA current of ring laser A i.e. output of ST-1 given to ST-2. The current is varied from $I_A = 48.9$ mA to $I_A = 50$ mA, it is observed that Proteresis can be achieved in only specific range of currents. It can be seen that Proteresis lasts until current value is $I_A = 49.6$ mA and at $I_A = 50$ mA, the loop changes to Hysteresis. It can also be seen that the rise time is not changing much and the falling edge moves from right-side to left-side of the rise time shifting from Proteresis to hysteresis. As the current increases from $I_A = 48.9$ mA the loop gets narrower and finally at $I_A = 50$ mA shifts to hysteresis.
2. FIG. 23B shows the effect of varying SOA current of ring laser X i.e. threshold values of ST-1. The values range from $I_X = 147.9$ to $I_X = 148.4$ mA. Proteresis was achieved at $I_X = 147.9$ and at $I_X = 148.4$ mA the Proteresis loop changes to hysteresis loop. The loop takes multiple stable values if the current is reduced below $I_X = 147.9$ mA.
3. FIG. 23C shows the effect of varying SOA current of ring laser Y i.e. threshold values of ST-2. The values range from $I_Y = 169.2$ mA to $I_Y = 170.9$ mA. Proteresis was achieved at $I_Y = 169.2$ and at $I_Y = 170.4$ mA the Proteresis loop changes to hysteresis loop and if current is still increased to $I_Y = 170.9$ mA the width of hysteresis loop increases. The loop takes multiple stable values if the current is reduced below $I_Y = 169.2$ mA.

It can be concluded that the Proteresis behavior is achieved (i.e. the three conditions mentioned earlier in this report for Proteresis) in very confined values of SOA currents of ring lasers.

Figure 24A:
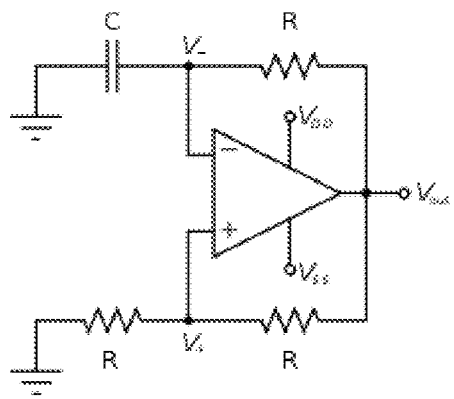
FIGS. 24A through 24C illustrate an oscillator circuit, a Schmitt Trigger Relaxation Oscillator and a Proteretic bi-stable device replacing a Schmitt Trigger in a Relaxation Oscillator.
Figure 24B:
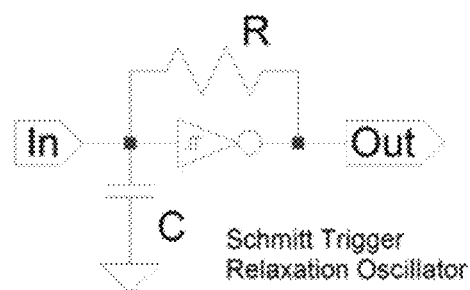
Figure 24C:
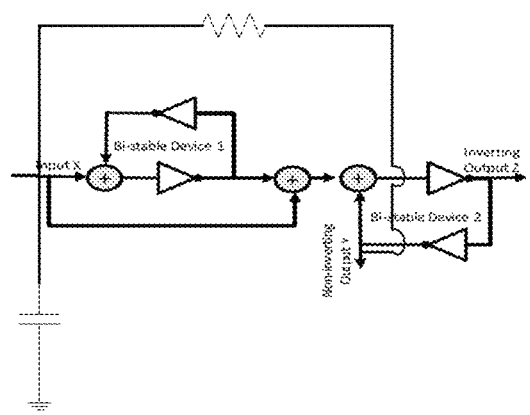

Referring to FIGS. 24A through 24C, an oscillator circuit, a Schmitt Trigger Relaxation Oscillator and a Proteretic bi-stable device replacing a Schmitt Trigger in the Relaxation Oscillator is illustrated. These illustrations are merely representative of a category of circuitry, however, the specific implementation is not intended to limit the scope of the technology as disclosed and claimed herein. An electronic oscillator is an electronic circuit that produces a periodic, oscillating electronic signal, often a sine wave or a square wave. Oscillators convert direct current (DC) from a power supply to an alternating current (AC) signal. They are widely used in many electronic devices. Common examples of signals generated by oscillators include signals broadcast by radio and television transmitters, clock signals that regulate computers and quartz clocks. A Schmitt trigger is a comparator circuit with hysteresis implemented by applying positive feedback to the noninverting input of a comparator or differential amplifier. It is an active circuit which converts an analog input signal to a digital output signal. The circuit is named a "trigger" because the output retains its value until the input changes sufficiently to trigger a change. In the non-inverting configuration, when the input is higher than a chosen threshold, the output is high. When the input is below a different (lower) chosen threshold the output is low, and when the input is between the two levels the output retains its value. This dual threshold action is called hysteresis and implies that the Schmitt trigger possesses memory and can act as a bi-stable multi-vibrator (latch or flip-flop). There is a close relation between the two kinds of circuits: a Schmitt trigger can be converted into a latch and a latch can be converted into a Schmitt trigger. The Schmitt Trigger in FIG. 24B is being utilized in a Relaxation Oscillator. FIG. 24C illustrates how the technology as disclosed and claimed can be utilized in lieu of the Schmitt Trigger.

The various illustrative examples shown above illustrate an all optical proteretic based integrated circuit. A user of the present technology may choose any of the above implementation, or an equivalent thereof, depending upon the desired application. In this regard, it is recognized that various forms of the subject technology could be utilized without departing from the scope of the present technology as disclosed.

Other aspects, objects and advantages of the present invention can be obtained from a study of the drawings, the disclosure and the appended claims.

What is claimed is:

1. A proteretic bi-stable device comprising:
    a first inverting bi-stable device having a hysteretic threshold function, a first input, and a first output, where said first input and said first output are coupled to a second input of a second bi-stable device having a hysteretic threshold function; and
    an input signal, where switching of the proteretic bi-stable device occurs when a lower threshold is reached in an increasing direction of the input signal and when an upper threshold is reached in a decreasing direction of the input signal.

2. The proteretic bi-stable device as recited in claim 1, where the first inverting bi-stable device and the second bi-stable device to which the first inverting bi-stable device is coupled are both bi-stable electronic semiconductor devices.

3. The proteretic bi-stable device as recited in claim 1, where the first inverting bi-stable device and the second bi-stable device to which the first inverting bi-stable device is coupled are both bi-stable optical devices, where each of the first inverting bi-stable device and the second bi-stable device are comprised of an optical input and an optical output.

4. The proteretic bi-stable device as recited in claim 1, included as a switching device for an oscillator to thereby increase an oscillation rate of the oscillator without increasing an integration intrinsic speed of the oscillator.

5. The proteretic bi-stable device as recited in claim 4, where the oscillator is an optical oscillation device.

6. The proteretic bi-stable device as recited in claim 4 comprises the switching device and the oscillator, where a third output of the proteretic bi-stable device is connected to a third input of the proteretic bi-stable device.

7. The proteretic bi-stable device as recited in claim 1, included as a switching device for a delta-sigma modulator to thereby increase a modulation rate for the delta-sigma modulator.

8. The proteretic bi-stable device as recited in claim 1, included as a switching device for a stable dynamical system to thereby increase a relaxation rate without increasing an intrinsic rate.

9. The proteretic bi-stable device as recited in claim 1, included as a switching device for an artificial neural network with feedback to thereby increase a convergence rate of the artificial neural network without increasing an intrinsic rate.

10. The proteretic bi-stable device as recited in claim 1, is operated as a reversed Schmitt trigger.

11. The proteretic bi-stable device as recited in claim 1, where the first inverting bi-stable device and the second bi-stable device to which the first inverting bi-stable device is coupled are both comprised of two coupled semiconductor ring lasers.

12. The proteretic bi-stable device as recited in claim 11, is operated as a reversed Schmitt trigger.

* * * * *